US011326679B2

(12) United States Patent
Borgaonkar et al.

(10) Patent No.: US 11,326,679 B2
(45) Date of Patent: May 10, 2022

(54) LOCKING DIFFERENTIAL ASSEMBLY

(71) Applicant: EATON INTELLIGENT POWER LIMITED, Dublin (IE)

(72) Inventors: Jyoti Borgaonkar, Latur (IN); Varsha Mohan Nemane, Ahmednagar (IN); Sudhakar Sangle, Pune (IN); Chad Hillman, Marshall, MI (US); Jordan Allen, Marshall, MI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/963,148

(22) PCT Filed: Jan. 21, 2019

(86) PCT No.: PCT/EP2019/025019
§ 371 (c)(1),
(2) Date: Jul. 17, 2020

(87) PCT Pub. No.: WO2019/141512
PCT Pub. Date: Jul. 25, 2019

(65) Prior Publication Data
US 2020/0355254 A1    Nov. 12, 2020

(30) Foreign Application Priority Data
Jan. 20, 2018   (IN) .............................. 201811002425

(51) Int. Cl.
*F16H 48/08*     (2006.01)
*F16H 48/24*     (2006.01)
(Continued)

(52) U.S. Cl.
CPC ............. *F16H 48/08* (2013.01); *F16H 48/24* (2013.01); *F16H 2048/085* (2013.01); *F16H 2048/204* (2013.01); *F16H 2048/346* (2013.01)

(58) Field of Classification Search
CPC .... F16H 48/08–2048/087; F16H 48/20; F16H 48/24; F16H 48/30–2048/346; F16H 2048/204
See application file for complete search history.

(56) References Cited

U.S. PATENT DOCUMENTS 7,247,118 B2      7/2007   Haruki et al.
2015/0133254 A1 *  5/2015   Fox ......................... F16H 48/08
                                                  475/150
(Continued)

FOREIGN PATENT DOCUMENTS

WO    WO 2014/028054        2/2014
WO    WO 2014/116802        7/2014
WO    WO-2018003054 A1 *    1/2018   ............. F16D 27/14

*Primary Examiner* — Ernesto A Suarez
*Assistant Examiner* — James J Taylor, II
(74) *Attorney, Agent, or Firm* — RMCK Law Group PLC

(57) ABSTRACT

A locking differential assembly (10) includes a differential case (12). A lock ring (40) is selectably engagable with a first side gear (18, 20) to selectably prevent the first side gear (18, 20) and a second side gear (18, 20) from rotating relative to the differential case (12). A plunger (30) is translatable along a plunger axis (55) through a bore (68) in the differential case (12). The plunger (30) is to be in contact with the lock ring (40) at least when the lock ring (40) is engaged with the first side gear (18, 20). A position of the plunger (30) relative to the differential case (12) along the plunger axis (55) is indicative of an engagement status of the lock ring (40). A non-contacting sensor is connected to the differential case (12) and located a fixed, predetermined distance from the differential case (12). The sensor is to detect a proximity of the plunger (30) to the sensor and to output an electrically detectable signal indicative of the engagement status of the lock ring (40).

16 Claims, 4 Drawing Sheets

(51) Int. Cl.
F16H 48/20 (2012.01)
F16H 48/34 (2012.01)

(56) References Cited

U.S. PATENT DOCUMENTS

2015/0204431 A1* 7/2015 Cochren ................ F16H 48/08
  475/150
2017/0297428 A1* 10/2017 Inose .................... B60K 23/04

* cited by examiner

LOCKING DIFFERENTIAL ASSEMBLY

BACKGROUND

A locking differential may have an additional capability compared to a conventional "open" automotive differential. A vehicle with a locking differential may experience increased use of traction at the drive wheels compared to a vehicle with an "open" differential. Use of traction may be increased by restricting each of the two drive wheels on an axle to the same rotational speed without regard to the available traction or the road path taken at each wheel. The locking differential causes both wheels on an axle to turn together as if on a common axle shaft.

An open differential, or unlocked locking differential allows each wheel on an axle to rotate at different speeds. When a vehicle negotiates a turn, the wheel on the smaller (inner) radius rotates more slowly than the wheel on the larger (outer) radius. Without the unlocked or open differential, one of the tires may scuff in a turn. With an open differential, when one wheel of an axle is on a slippery road surface, the wheel on the slippery surface may tend to spin while the other wheel may not have enough torque applied to it to move the vehicle. For example, some vehicles with open differentials may be unable to climb a hill with wet ice under one of the wheels no matter how dry the pavement is under the other wheel (this may be known as a split-mu surface).

In contrast, a locked differential forces wheels on both sides of the same axle to rotate together at the same speed. Therefore, each wheel can apply as much torque as the wheel/road traction and the powertrain capacity will allow. In the example of the vehicle on the hill with the split-mu surface, a locked differential may allow the vehicle to climb the hill that is impossible for an otherwise identical vehicle to climb with an open differential. Locking differentials may also provide better traction that leads to improved vehicle performance under certain conditions, for example in drag racing, or snow plow operations.

Some vehicles have differentials that may be reconfigured from an unlocked state to a locked state. Such vehicles may be operated with the differential in the unlocked state for normal conditions, for example, to prevent tire scuffing in turns, and reconfigured for operation with a locked differential when wheel slippage is encountered.

SUMMARY

A locking differential assembly includes a differential case defining an axis of rotation. A lock ring is selectably engagable with a first side gear to selectably prevent the first side gear and a second side gear from rotating relative to the differential case. A plunger is translatable along a plunger axis through a bore in the differential case. The plunger is to be in contact with the lock ring at least when the lock ring is engaged with the first side gear. A position of the plunger relative to the differential case along the plunger axis is indicative of an engagement status of the lock ring. A non-contacting sensor is connected to the differential case. The non-contacting sensor is located a fixed, predetermined distance from the differential case. The non-contacting sensor is to detect a proximity of the plunger to the non-contacting sensor and to output an electrically detectable signal indicative of the engagement status of the lock ring.

INTRODUCTION

A first aspect disclosed herein is a locking differential assembly, comprising: a differential case defining an axis of rotation; a lock ring selectably engagable with a first side gear to selectably prevent the first side gear and a second side gear from rotating relative to the differential case; a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring; and a non-contacting sensor connected to the differential case, wherein: the non-contacting sensor is located a fixed, predetermined distance from the differential case; and the non-contacting sensor is to detect a proximity of the plunger to the non-contacting sensor and to output an electrically detectable signal indicative of the engagement status of the lock ring.

In an example of this first aspect, the plunger is spring-loaded to remain in contact with the lock ring.

In an example of this first aspect, the plunger axis is parallel to the axis of rotation, the plunger axis is spaced apart from the axis of rotation by a predetermined radius, and the plunger axis intersects the non-contacting sensor at a predetermined angle of rotation of the differential case about the axis of rotation.

In an example of this first aspect, the plunger has a contact end and a sensed end distal to the contact end, and the plunger has a penetrating portion, the penetrating portion slidingly disposed through the bore in the differential case.

In an example of this example of this first aspect, the plunger includes: a cylindrical neck extending from a cylindrical shank, the cylindrical neck has a neck diameter smaller than a shank diameter, a shoulder is defined at an interface between the cylindrical neck and the cylindrical shank, the bore is a stepped cylindrical bore having a small diameter portion and a large diameter portion, the small diameter portion makes a sliding fit with the cylindrical neck, the large diameter portion makes a sliding fit with the cylindrical shank, and a helical spring is disposed around the cylindrical neck at least partially within the large diameter portion.

In an example of this first aspect, the locking differential assembly further comprises a spring connected to the plunger to urge the plunger toward the lock ring.

In an example of this example of this first aspect, the spring is a helical spring disposed around a neck of the plunger between the differential case and a shoulder of the plunger.

In an example of this first aspect, the locking differential assembly further comprises a plunger cartridge assembly rigidly attached to the differential case, the plunger cartridge assembly including: a plunger cartridge body having a cartridge bore defined therein along the plunger axis; the plunger having a contact end and a sensed end distal to the contact end, wherein: the plunger is slidingly disposed in the cartridge bore; and the plunger has a penetrating portion, the penetrating portion slidingly disposed in the cartridge bore; and a spring disposed in the cartridge bore, the spring being connected to the plunger to urge the plunger toward the lock ring.

In an example of this example of this first aspect, the spring is a helical spring disposed between the differential case and a shoulder of the plunger.

In another example of this example of this first aspect, the plunger cartridge body has threads defined on a cartridge outer diameter, the differential case has complementary threads defined therein, and the threads defined in the plunger cartridge body engage the complementary threads defined in the differential case to rigidly attach the plunger cartridge assembly to the differential case.

In an example of this first aspect, the locking differential assembly further comprises a bracket connected to the differential case to support the non-contacting sensor, and a bearing disposed between the bracket and the differential case to reduce friction and wear between the bracket and the differential case during rotation of the differential case about the axis of rotation.

In an example of this example of this first aspect, the locking differential assembly further comprises a threaded nut attached to the bracket to attach the non-contacting sensor to the bracket.

In another example of this example of this first aspect, the locking differential assembly further comprises a retention ring disposed partially in an annular groove defined in the differential case to retain the bracket on the differential case.

In yet another example of this example of this first aspect, the bearing is a thrust needle roller bearing.

In an example of this first aspect, the sensor is a Hall-Effect sensor.

In an example of this first aspect, the sensor is a variable reluctance sensor.

In an example of this first aspect, the locking differential assembly further comprises: a gear chamber defined by the differential case; wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear.

In an example of this example of this first aspect, the locking differential assembly further comprises: side gear dogs defined on an outside diameter of the first side gear parallel to the axis of rotation; complementary dogs defined around an inside surface of the lock ring, the complementary dogs selectably engagable with the side gear dogs by translating the lock ring along the axis of rotation from a disengaged position to an engaged position; and a disengagement spring disposed between the differential case and the lock ring to bias the lock ring toward the disengaged position; wherein the first side gear is substantially prevented from rotating relative to the differential case when the lock ring is in the engaged position, and the second side gear is free to rotate relative to the differential case when the lock ring is in the disengaged position.

It is to be understood that any features of the locking differential assembly disclosed herein may be combined together in any desirable manner and/or configuration.

A second aspect disclosed herein is a locking differential assembly, comprising: a differential case defining an axis of rotation; a lock ring selectably engagable with a first side gear to selectably prevent the first side gear and a second side gear from rotating relative to the differential case; a plunger translatable along a plunger axis through a bore in the differential case, the plunger being spring-loaded to remain in contact with the lock ring, a position of the plunger relative to the differential case along the plunger axis being indicative of an engagement status of the lock ring; a non-contacting sensor connected to the differential case, wherein: the non-contacting sensor is located a fixed, pre-determined distance from the differential case; and the non-contacting sensor is to detect a proximity of the plunger to the non-contacting sensor and to output an electrically detectable signal indicative of the engagement status of the lock ring; a bracket connected to the differential case to support the non-contacting sensor; a threaded nut attached to the bracket to attach the non-contacting sensor to the bracket; a retention ring disposed partially in an annular groove defined in the differential case to retain the bracket on the differential case; and a thrust needle roller bearing disposed between the bracket and the differential case to reduce friction and wear between the bracket and the differential case during rotation of the differential case about the axis of rotation; a gear chamber defined by the differential case, wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear; side gear dogs defined on an outside diameter of the first side gear parallel to the axis of rotation; complementary dogs defined around an inside surface of the lock ring, the complementary dogs selectably engagable with the side gear dogs by translating the lock ring along the axis of rotation from a disengaged position to an engaged position; and a disengagement spring disposed between the differential case and the lock ring to bias the lock ring toward the disengaged position; wherein: the first side gear is substantially prevented from rotating relative to the differential case when the lock ring is in the engaged position, and the second side gear is free to rotate relative to the differential case when the lock ring is in the disengaged position; the plunger axis is parallel to the axis of rotation; the plunger axis is spaced apart from the axis of rotation by a predetermined radius; and the plunger axis intersects the non-contacting sensor at a predetermined angle of rotation of the differential case about the axis of rotation; the plunger has a contact end and a sensed end distal to the contact end; the plunger has a penetrating portion, the penetrating portion slidingly disposed through the bore in the differential case; the plunger includes a cylindrical neck extending from a cylindrical shank; the cylindrical neck has a neck diameter smaller than a shank diameter; a shoulder is defined at an interface between the cylindrical neck and the cylindrical shank; the bore is a stepped cylindrical bore having a small diameter portion and a large diameter portion; the small diameter portion makes a sliding fit with the cylindrical neck; the large diameter portion makes a sliding fit with the cylindrical shank; a helical spring is disposed around the cylindrical neck between the differential case and the shoulder of the plunger, at least partially within the large diameter portion; the helical spring is connected to the plunger to urge the plunger toward the lock ring; and the sensor is selected from the group consisting of a Hall-Effect sensor and a variable reluctance sensor.

It is to be understood that any features of the second aspect locking differential assembly disclosed herein may be combined together in any desirable manner and/or configuration.

A third aspect disclosed herein is a locking differential system, comprising: the locking differential assembly disclosed in the first aspect; an electrical switch to selectably close a circuit to provide electrical power to a lock ring actuator; an electronic status indicator; and an electronic driver circuit for powering the electronic status indicator to indicate a status of the locking differential system wherein the status includes at least three states.

In an example of this third aspect, the electronic driver circuit includes an electronic control unit (ECU) in communication with the non-contacting sensor to receive the electrically detectable signal indicative of the engagement status of the lock ring, the ECU to determine the status of the locking differential system based on the electrically detectable signal output by the non-contacting sensor.

In an example of this third aspect, the status is selected from the group consisting of a first state, a second state, and a third state; the first state is a disengaged state having the electrical switch in an open condition to disconnect power to the lock ring actuator and the lock ring is in the disengaged position; the second state is an engaged state having the electrical switch in a closed condition connecting power to the lock ring actuator and the lock ring is in the engaged position; and the third state is a transition state having the electrical switch in an open condition disconnecting power to the lock ring actuator and the lock ring is in the engaged position or the electrical switch is in a closed condition connecting power to the lock ring actuator and the lock ring is in the disengaged position.

In an example of this example of this third aspect, the electronic status indicator is a selectably illuminated indicator and the status is indicated by a flash code.

It is to be understood that any features of the locking differential system disclosed herein may be combined together in any desirable manner and/or configuration.

A fourth aspect disclosed herein is a sensor system for detecting an engagement status of a lock ring in a differential assembly, comprising: a selectably locking differential for a vehicle axle; a differential case defining an axis of rotation; a lock ring selectably engagable with a first side gear to selectably prevent the first side gear and a second side gear from rotating relative to the differential case; a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring; and a non-contacting sensor connected to the differential case, wherein: the non-contacting sensor is located a fixed, predetermined distance from the differential case; and the non-contacting sensor is to detect a proximity of the plunger to the non-contacting sensor and to output an electrically detectable signal indicative of the engagement status of the lock ring.

In an example of this fourth aspect, the plunger axis is parallel to the axis of rotation; the plunger axis is spaced apart from the axis of rotation by a predetermined radius; and the plunger axis intersects the non-contacting sensor at a predetermined angle of rotation of the differential case about the axis of rotation.

In an example of this fourth aspect, the plunger has a contact end and a sensed end distal to the contact end; and the plunger has a penetrating portion, the penetrating portion slidingly disposed through the bore in the differential case.

In an example of this example of this fourth aspect, the plunger includes a cylindrical neck extending from a cylindrical shank; the cylindrical neck has a neck diameter smaller than a shank diameter; a shoulder is defined at an interface between the cylindrical neck and the cylindrical shank; the bore is a stepped cylindrical bore having a small diameter portion and a large diameter portion; the small diameter portion makes a sliding fit with the cylindrical neck; the large diameter portion makes a sliding fit with the cylindrical shank; and a helical spring is disposed around the cylindrical neck at least partially within the large diameter portion.

In an example of this fourth aspect, the sensor system further comprises a spring connected to the plunger to urge the plunger toward the lock ring. the spring is a helical spring disposed around a neck of the plunger between the differential case and a shoulder of the plunger.

In an example of this fourth aspect, the sensor system further comprises a plunger cartridge assembly rigidly attached to the differential case, the plunger cartridge assembly including: a plunger cartridge body having a cartridge bore defined therein along the plunger axis; the plunger having a contact end and a sensed end distal to the contact end, wherein: the plunger is slidingly disposed in the cartridge bore; and the plunger has a penetrating portion, the penetrating portion slidingly disposed in the cartridge bore; and a spring disposed in the cartridge bore, the spring being connected to the plunger to urge the plunger toward the lock ring. In an example of this example of this fourth aspect, the spring is a helical spring disposed between the differential case and a shoulder of the plunger. In another example of this example of this fourth aspect, the plunger cartridge body has threads defined on a cartridge outer diameter; the differential case has complementary threads defined therein; and the threads defined in the plunger cartridge body engage the complementary threads defined in the differential case to rigidly attach the plunger cartridge assembly to the differential case.

In an example of this fourth aspect, the sensor system further comprises: a bracket connected to the differential case to support the non-contacting sensor; and a bearing disposed between the bracket and the differential case to reduce friction and wear between the bracket and the differential case during rotation of the differential case about the axis of rotation. In an example of this example of this fourth aspect, the sensor system further comprises a threaded nut attached to the bracket to attach the non-contacting sensor to the bracket. In another example of this example of this fourth aspect, the sensor system, further comprises a retention ring disposed partially in an annular groove defined in the differential case to retain the bracket on the differential case. In yet another example of this example of this fourth aspect, the bearing is a thrust needle roller bearing.

In an example of this fourth aspect, the sensor is a Hall-Effect sensor.

In an example of this fourth aspect, the sensor is a variable reluctance sensor.

In an example of this fourth aspect, the sensor system further comprises: a gear chamber defined by the differential case, wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear. In an example of this example of this fourth aspect, the sensor system further comprises: side gear dogs defined on an outside diameter of the first side gear parallel to the axis of rotation; complementary dogs defined around an inside surface of the lock ring, the complementary dogs selectably engagable with the side gear dogs by translating the lock ring along the axis of rotation from a disengaged position to an engaged position; a spring disposed between the differential case and the lock ring to bias the lock ring toward the disengaged position; and wherein the first side gear is substantially prevented from rotating relative to the differential case when the lock ring is in the engaged position, and the second side gear is free to rotate relative to the differential case when the lock ring is in the disengaged position.

It is to be understood that any features of the sensor system disclosed herein may be combined together in any desirable manner and/or configuration.

A fifth aspect disclosed herein is a sensor system for detecting an engagement status of a lock ring in a differential assembly, comprising: a selectably locking differential for a vehicle axle; a differential case defining an axis of rotation; a lock ring selectably engagable with a first side gear to selectably prevent the first side gear and a second side gear from rotating relative to the differential case; a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring; and a non-contacting sensor connected to the differential case, wherein: the non-contacting sensor is located a fixed, predetermined distance from the differential case; the non-contacting sensor is to detect a proximity of the plunger to the non-contacting sensor and to output an electrically detectable signal indicative of the engagement status of the lock ring; a bracket connected to the differential case to support the non-contacting sensor; a threaded nut attached to the bracket to attach the non-contacting sensor to the bracket; a retention ring disposed partially in an annular groove defined in the differential case to retain the bracket on the differential case; and a thrust needle roller bearing disposed between the bracket and the differential case to reduce friction and wear between the bracket and the differential case during rotation of the differential case about the axis of rotation; a gear chamber defined by the differential case, wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear; side gear dogs defined on an outside diameter of the first side gear parallel to the axis of rotation; complementary dogs defined around an inside surface of the lock ring, the complementary dogs selectably engagable with the side gear dogs by translating the lock ring along the axis of rotation from a disengaged position to an engaged position; and a disengagement spring disposed between the differential case and the lock ring to bias the lock ring toward the disengaged position; wherein: the plunger axis is parallel to the axis of rotation; the plunger axis is spaced apart from the axis of rotation by a predetermined radius; and the plunger axis intersects the non-contacting sensor at a predetermined angle of rotation of the differential case about the axis of rotation.

In an example of this fifth aspect, the plunger has a contact end and a sensed end distal to the contact end; the plunger has a penetrating portion, the penetrating portion slidingly disposed through the bore in the differential case; the plunger includes a cylindrical neck extending from a cylindrical shank; the cylindrical neck has a neck diameter smaller than a shank diameter; a shoulder is defined at an interface between the cylindrical neck and the cylindrical shank; the bore is a stepped cylindrical bore having a small diameter portion and a large diameter portion; the small diameter portion makes a sliding fit with the cylindrical neck; the large diameter portion makes a sliding fit with the cylindrical shank; a helical spring is disposed around the cylindrical neck at least partially within the large diameter portion; and the helical spring is disposed around a neck of the plunger between the differential case and the shoulder of the plunger, the helical spring to urge the plunger toward the lock ring.

In an example of this fifth aspect, the sensor system further comprises a plunger cartridge assembly rigidly attached to the differential case, the plunger cartridge assembly including: a plunger cartridge body having a cartridge bore defined therein along the plunger axis; and the plunger having a contact end and a sensed end distal to the contact end, wherein: the plunger is slidingly disposed in the cartridge bore; the plunger has a penetrating portion, the penetrating portion slidingly disposed in the cartridge bore; a helical spring is disposed in the cartridge bore, the helical spring being connected to the plunger to urge the plunger toward the lock ring; the helical spring is disposed between the differential case and a shoulder of the plunger; the plunger cartridge body has threads defined on a cartridge outer diameter; the differential case has complementary threads defined therein; and the threads defined in the plunger cartridge body engage the complementary threads defined in the differential case to rigidly attach the plunger cartridge assembly to the differential case.

It is to be understood that any features of the fifth aspect sensor system disclosed herein may be combined together in any desirable manner and/or configuration.

Further, it is to be understood that any combination of features of any aspect of the locking differential assembly and/or of the locking differential system and/or of any aspect of the sensor system may be used and/or combined together in any desirable manner, and/or may be used and/or combined with any of the examples disclosed herein.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

The present disclosure relates generally to locking differentials, and more particularly to electronically controlled locking differentials used in vehicle drive axles. As used herein, an electronically controlled locking differential means a differential that changes between an unlocked state and a locked state in response to an electronic signal. In the locked state, both axle shafts connected to the differential rotate together in the same direction, at the same speed. The electronic signal may be automatically produced in response to a vehicle condition, for example, detection of wheel slippage. The electronic signal may also be produced in response to a demand from an operator, for example, an operator may press a button on a control panel of the vehicle.

Examples of the present disclosure may allow the differentials to operate at a higher torque than similarly sized existing locking differentials. Further, the status indicator may provide a more satisfactory user experience by providing more detailed and accurate information regarding the operation of the electronically controlled locking differential system of the present disclosure. For example, in applications where the locking differential is installed on a steering axle, e.g., on the front axle of a front wheel drive vehicle, operating in the locked state may change the steering dynamics of the vehicle. As such, examples of the present disclosure may quickly provide an indication of the engagement status of the locking differential.

Figure 1:
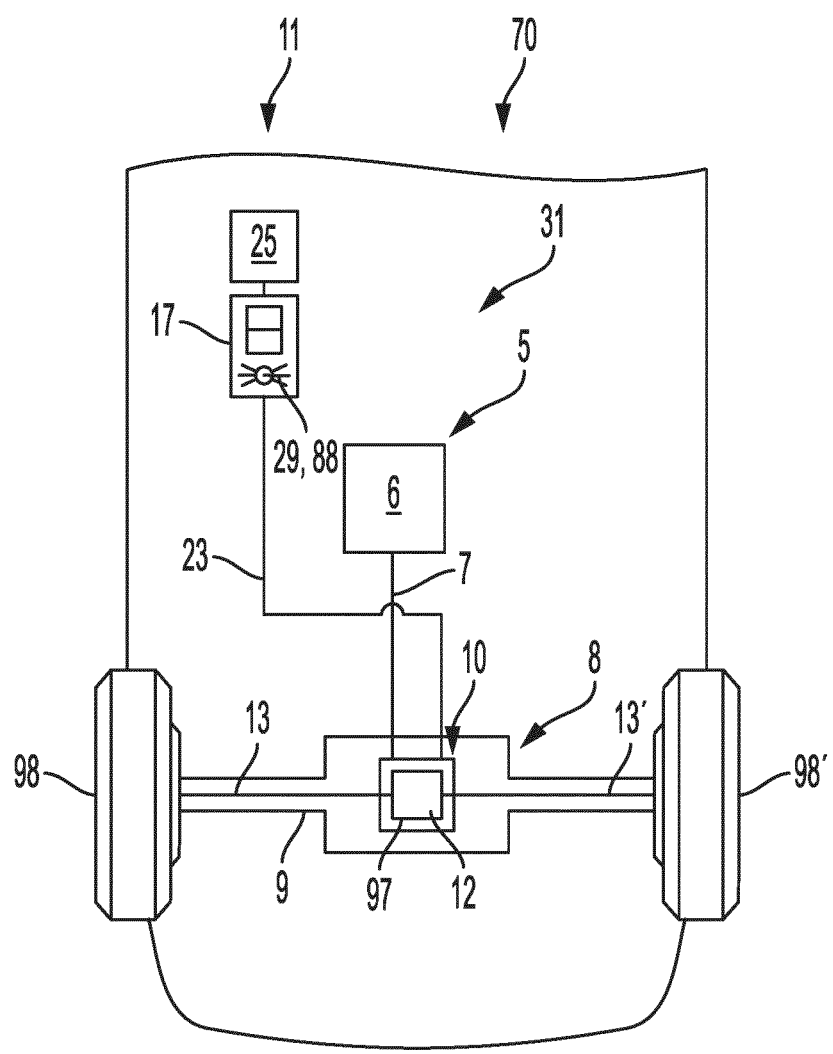
FIG. 1 is a schematic view of a vehicle with a locking differential system according to an example of the present disclosure.

Referring to FIG. 1, a powertrain 5 for a vehicle 70 includes a motor 6, a propeller shaft 7 connected to the motor and an axle assembly 8. The propeller shaft 7 is connected, for example, by gearing (not shown) to rotationally drive the axle shafts 13, 13' inside the axle housing 9. The axle assembly 8 includes the axle housing 9, a locking differential assembly 10 supported in axle housing 9 and the axle shafts 13, 13' respectively connected to first and second drive wheels 98 and 98'. The axle housing 9 may be part of a transaxle. A gearset 97 disposed within a differential case 12 transfers rotational power from differential case 12 to the axle shafts 13, 13', and selectably allows relative rotation between the axle shafts 13 and 13'. The locking differential assembly 10 of the present disclosure may be included in rear axles for rear-wheel drive vehicles, transaxles for use in front-wheel drive vehicles, transfer cases for use in four-wheel drive vehicles or in any vehicle powertrain.

Figure 2:
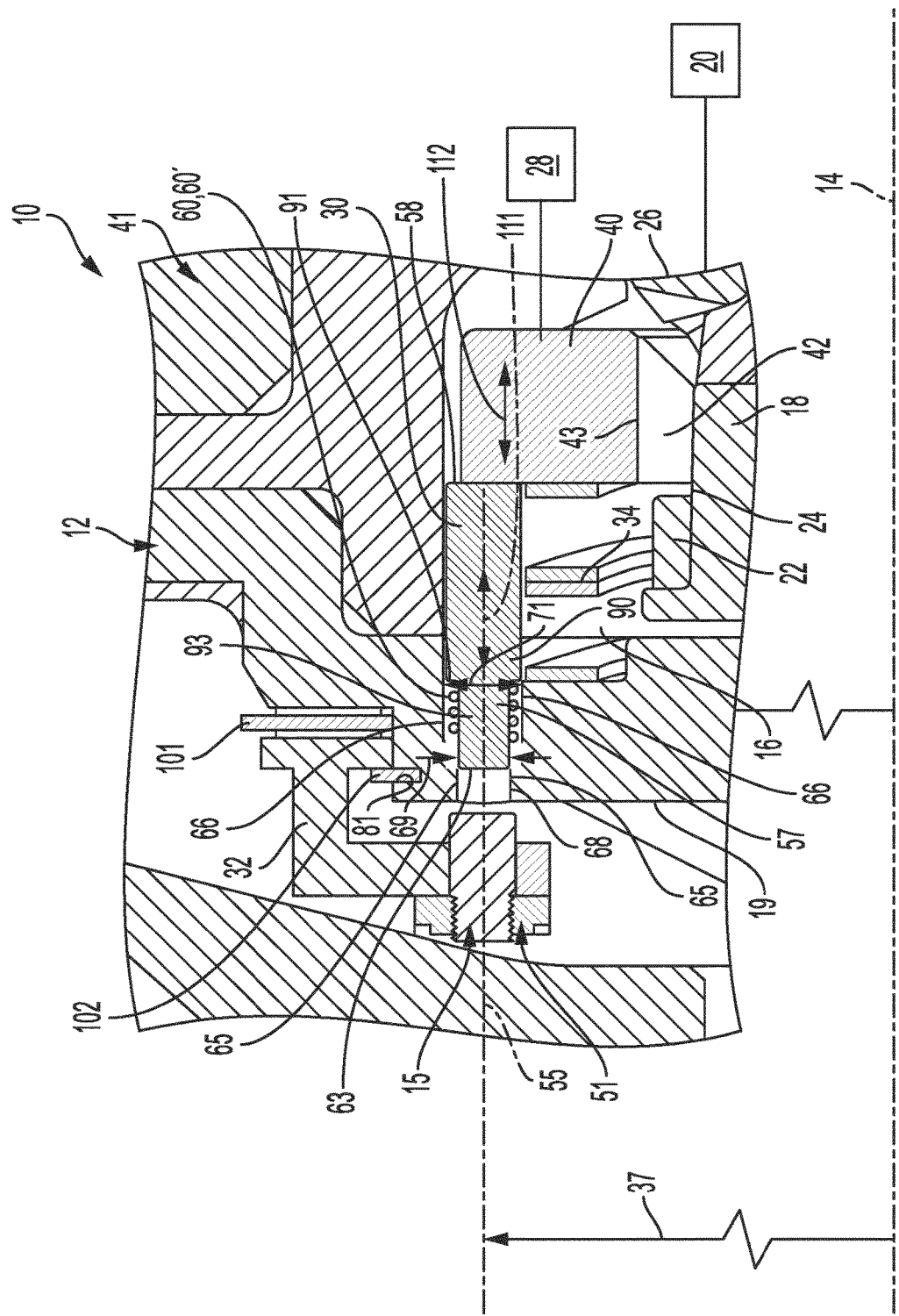
FIG. 2 is a semi-schematic cross-sectional view of an example of the differential assembly with the lock ring in the disengaged position according to the present disclosure.

Referring to FIG. 2, an example of a portion of a cross-section of a locking differential assembly 10 is schematically depicted. The locking differential assembly 10 has a differential case 12 defining an axis of rotation 14 and a gear chamber 16. The differential case 12 rotates in the axle housing 9 (see FIG. 1) about the axis of rotation 14. A first side gear 18 is disposed at a first end 19 of the differential case 12 for selectable relative rotation thereto. A second side gear 20 (shown schematically in FIG. 2) is disposed at a second end (not shown) of the differential case 12 opposite the first end 19 for selectable rotation relative to the differential case 12.

The first side gear 18 has side gear dogs 22 defined on an outside diameter 24 of the first side gear 18 parallel to the axis of rotation 14. At least two pinion gears 26 are rotatably supported in the gear chamber 16. Each of the at least two pinion gears 26 is in meshing engagement with the first side gear 18 and the second side gear 20. The first side gear 18 and the second side gear 20 are respectively connected to the axle shafts 13, 13' (see FIG. 1).

The locking differential assembly 10 includes a lock ring actuator 28 shown schematically connected to the lock ring 40.

FIG. 2 depicts a disengagement spring 34 disposed between the differential case 12 and the lock ring 40 to bias the lock ring 40 toward the disengaged position as shown in FIG. 2. A retention ring 102 is inserted into an annular groove 81 in the differential case 12 to prevent the bracket 32 from moving axially relative to the differential case 12.

In an example, the plunger 30 is fixed for rotation with the differential case 12, and the plunger 30 is translatable relative to the differential case 12 along the axis of rotation 14. As the differential case rotates about the axis of rotation 14, the plunger 30 orbits the axis of rotation 14. Thus the position of the plunger 30 is detectable by a non-contacting sensor 15 mounted on the bracket 32 at least once per rotation of the differential case 12 about the axis of rotation 14.

In examples of the present disclosure, the locking differential assembly 10 has a lock ring 40. The lock ring 40 includes complementary dogs 42 defined around an inside surface 43 of the lock ring 40. The complementary dogs 42 are selectably engagable with the side gear dogs 22 by translating the lock ring 40 along the axis of rotation 14 from a disengaged position shown in FIG. 2 to an engaged position to the left of the disengaged position in the orientation depicted in FIG. 2.

Examples of the locking differential assembly 10, according to the present disclosure, include a differential case 12 defining an axis of rotation 14. A lock ring 40 is selectably engagable with a first side gear 18 to selectably prevent the first side gear 18 and a second side gear 20 from rotating relative to the differential case 12. A plunger 30 is translatable along a plunger axis 55 through a bore 68 in the differential case 12. The plunger 30 is to be in contact with the lock ring at least when the lock ring 40 is engaged with the first side gear 18. In some examples, the plunger 30 may remain in contact with the lock ring 40. In some examples, the plunger 30 may be spring-loaded to remain in contact with the lock ring 40. A position of the plunger 30 relative to the differential case 12 along the plunger axis 55 is indicative of an engagement status of the lock ring 40.

A non-contacting sensor 15 is connected to the differential case 12. The non-contacting sensor 15 is located a fixed, predetermined distance from the differential case 12. The non-contacting sensor 15 is to detect a proximity of the plunger 30 to the non-contacting sensor 15 and to output an electrically detectable signal indicative of the engagement status of the lock ring 40.

The plunger axis 55 is parallel to the axis of rotation 14. The plunger axis 55 is spaced apart from the axis of rotation by a predetermined radius 37. As the differential case 12 rotates about the axis of rotation 14, the plunger 30 orbits the axis of rotation 14. The plunger axis 55 intersects the non-contacting sensor 15 once per orbit of the plunger 30 about the axis of rotation 14. The plunger axis 55 intersects the non-contacting sensor 15 at a predetermined angle of rotation of the differential case 12 about the axis of rotation 14.

The plunger 30 has a contact end 58 and a sensed end 63 distal to the contact end 58. The plunger 30 has a penetrating portion 57. The penetrating portion 57 is slidingly disposed through the bore 68 in the differential case 12.

Figure 4:
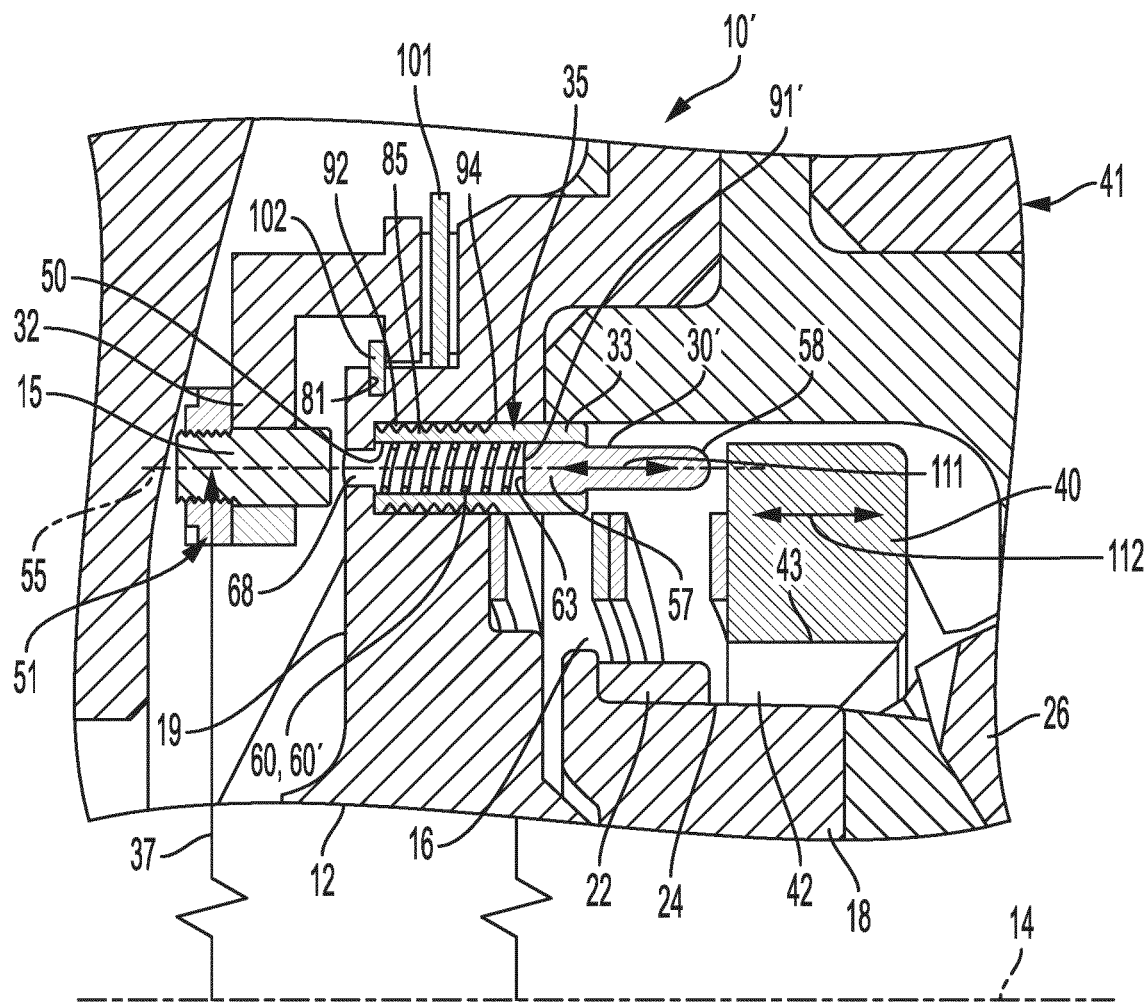
FIG. 4 is a semi-schematic cross-sectional view of another example of the differential assembly from FIG. 2 with an example of a plunger cartridge according to the present disclosure.
Figure 5:
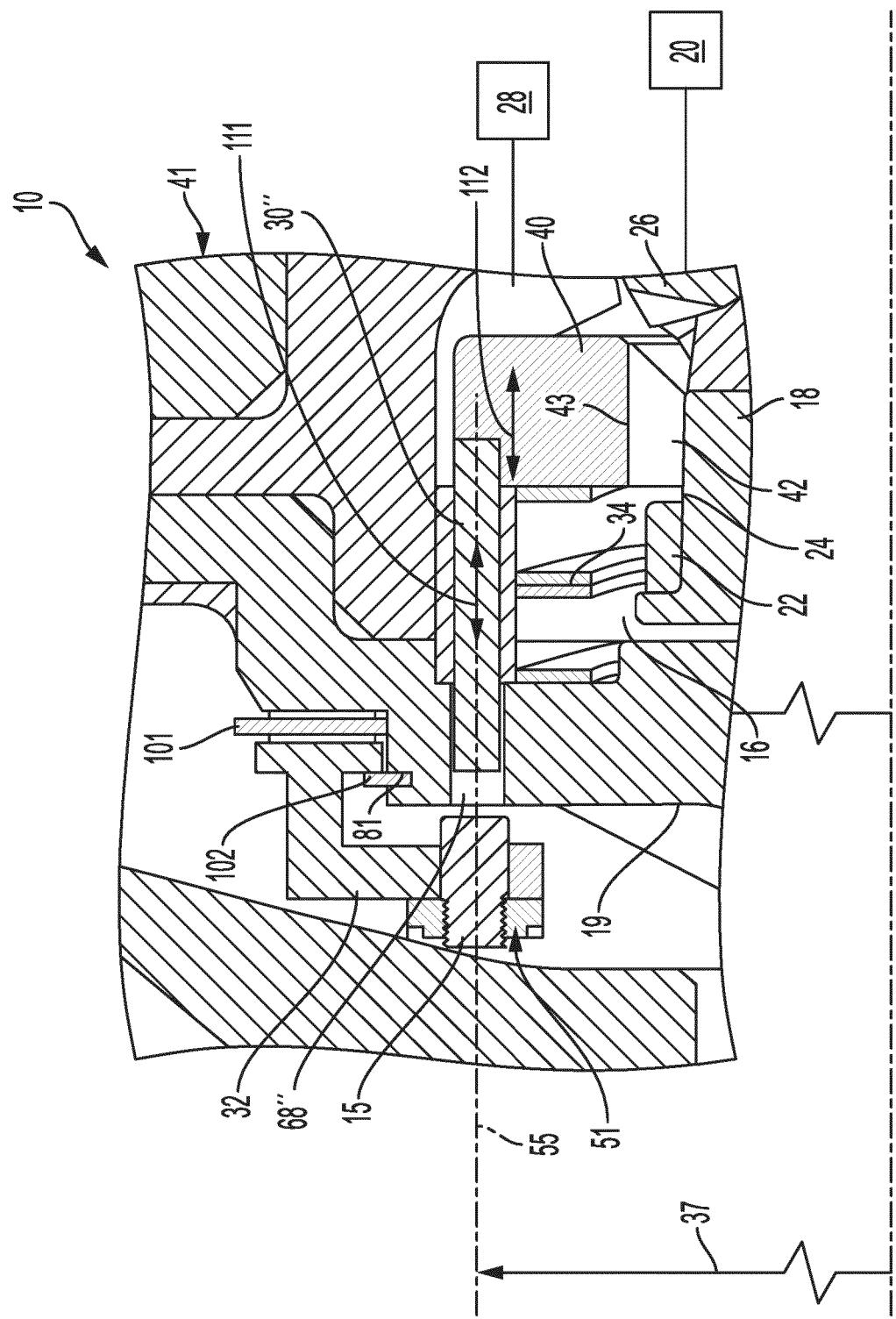
FIG. 5 is a semi-schematic cross-sectional view of another example of the differential assembly from FIG. 2 including an example of a plunger fixedly attached to the lock ring.

In FIG. 2, FIG. 4, and FIG. 5, double arrow 111 depicts the movement of the plunger 30, 30', 30" along the plunger axis 55. Double arrow 112 depicts the movement of the lock ring 40 parallel to the plunger axis 55 and the axis of rotation 14.

In the example depicted in FIG. 2, the plunger 30 includes a cylindrical neck 93 extending from a cylindrical shank 90. The cylindrical neck 93 has a neck diameter 69 smaller than a shank diameter 71. A shoulder 91 is defined at an interface between the cylindrical neck 93 and the cylindrical shank

90. The bore 68 is a stepped cylindrical bore having a small diameter portion 65 and a large diameter portion 66. As used herein, "small" diameter portion is used for identification of the small diameter portion 65. In this context, "small" means having a diameter that is smaller than the large diameter portion 66 by at least 0.001 inch. Similarly, "large" diameter portion is used herein for identification of the large diameter portion 66. In this context, "large" means having a diameter that is larger than the small diameter portion 65 by at least 0.001 inch. The small diameter portion 65 makes a sliding fit with the cylindrical neck 93. The large diameter portion 66 makes a sliding fit with the cylindrical shank 90. In an example, a sliding fit may be an ANSI 4.1 class I (loose fit), class II (free fit), class III (medium fit) or other similar fit that allows the plunger 30 to slide in the bore 68. A helical spring 60' is disposed around the cylindrical neck 93 at least partially within the large diameter portion 66. In the example depicted in FIG. 2, compression of the helical spring 60' causes the plunger 30 to be spring-loaded to remain in contact with the lock ring 40. Although a helical spring 60' is depicted in FIG. 2, it is to be understood that any suitable resilient element may be used as a spring 60 connected to the plunger 30 to urge the plunger 30 toward the lock ring 40. As depicted in FIG. 2, the spring 60 is a helical spring 60' disposed around a neck 93 of the plunger 30 between the differential case 12 and the shoulder 91 of the plunger 30.

In another example, depicted in FIG. 5, the plunger 30" is fixed to the lock ring 40. In this example, there is no spring 60, since the plunger 30 is fixed to the lock ring 40. As such, in this example, the plunger 30" is not spring-loaded. The plunger 30" may be attached to the lock ring 40 by any suitable manner. For example, the plunger 30 may be attached to the lock ring 40 with threads, by pressing into a press-fit bore, by adhesive, by welding, or any suitable attachment process or mechanism to affix the plunger 30 to the lock ring 40. The plunger 30" may be cylindrical with a single cross-sectional diameter, or the plunger may have any suitable shape. Accordingly, the bore 68''' may be cylindrical with a single cross-sectional diameter, or the bore 68''' may have any suitable shape that is compatible with sliding penetration by the plunger 30".

The plunger 30" may be a detectable feature formed into the lock ring 40 such that attachment is not required. It is to be understood that examples of the present disclosure may include more than one plunger 30". For example, a plurality of plungers 30" may be equally spaced at the same radius on the lock ring 40. In examples with a plurality of plungers 30", a plurality of bores 68 are defined in the differential case 12.

FIG. 4 is similar to FIG. 2, except in FIG. 4, a plunger cartridge assembly 35 is used in place of the plunger 30 and spring 60, 60' used in the example shown in FIG. 2. Some reference numerals may be shown in FIG. 2 but not shown in FIG. 4 when the item or feature being referenced in FIG. 4 is similar to the item or feature in FIG. 2. In the example depicted in FIG. 4, the locking differential assembly 10' includes a plunger cartridge assembly 35 rigidly attached to the differential case 12. The plunger cartridge assembly 35 may be rigidly attached using: a threaded connection, a press-fit connection, welding, adhesives, or any suitable attachment method. The plunger cartridge assembly 35 has a plunger cartridge body 33 with a cartridge bore 50 defined therein along the plunger axis 55. The plunger 30' has a contact end 58 and a sensed end 63 distal to the contact end 58. The plunger 30' is slidingly disposed in the cartridge bore 50. The plunger 30' has a penetrating portion 57. The penetrating portion 57 is slidingly disposed in the cartridge bore 50. A spring 60 is disposed in the cartridge bore 50. The spring 60 is connected to the plunger 30' to urge the plunger 30' toward the lock ring 40. As shown in the example depicted in FIG. 4, contact between the contact end 58 and the lock ring 40 may be interrupted when the lock ring 40 is fully disengaged as shown in FIG. 4. However, contact between the contact end 58 and the lock ring 40 is made as the lock ring 40 moves from being fully disengaged toward being engaged before any of the complementary dogs 42 of the lock ring 40 engage or make contact with the side gear dogs 22.

The spring 60 may be a helical spring 60' disposed between the differential case 12 and a shoulder 91' of the plunger 30'. As shown in FIG. 4, there may be no neck protruding from the shoulder 91'. As such, the sensed end 63 of the plunger 30' may be flat, or even with, the shoulder 91'. In other examples, there may be a cylindrical neck 93 similar to the example depicted in FIG. 2.

The plunger cartridge body 33 may have threads 85 defined on a cartridge outer diameter 94. The differential case 12 may have complementary threads 92 defined therein. The threads 85 defined in the plunger cartridge body 33 may engage the complementary threads 92 defined in the differential case 12 to rigidly attach the plunger cartridge assembly 35 to the differential case 12.

In the example depicted in FIG. 2, FIG. 4, and FIG. 5, a bracket 32 is connected to the differential case 12 to support the non-contacting sensor 15. A bearing 101 is disposed between the bracket 32 and the differential case 12 to reduce friction and wear between the bracket 32 and the differential case 12 during rotation of the differential case 12 about the axis of rotation 14.

A threaded nut 51 may be attached to the bracket 32 to attach the non-contacting sensor 15 to the bracket 32. In an example, the threaded nut 51 may be a weld nut. A retention ring 102 may be disposed partially in an annular groove 81 defined in the differential case 12 to retain the bracket 32 on the differential case 12. In examples, the retention ring 102 may be a double wound laminar ring. An example of a suitable retention ring 102 is a Spirolox® part number WS-587 available from Smalley Steel Ring Company, Lake Zurich, Ill. A split washer is another example of a retention ring 102.

In examples, the bearing 101 may be a thrust needle roller bearing. In other examples, the bearing 101 may be a thrust washer.

In examples of the present disclosure, the non-contacting sensor 15 may use any non-contacting position sensor technology. For example, a non-contacting sensor 15 based on magnetostriction, magnetoresistance, Hall-Effect, or other magnetic sensing technologies may be included in the locking differential assembly 10 according to the present disclosure. In an example, the non-contacting sensor may be a Hall-Effect sensor. In another example, the non-contacting sensor may be a variable reluctance sensor.

In examples, the locking differential assembly 10 may include a gear chamber 16 defined by the differential case 12. The first side gear 18 may be disposed at a first end 19 of the differential case 12 for selectable relative rotation between the first side gear 18 and the differential case 12. The second side gear 20 may be disposed at a second end (not shown) of the differential case 12 opposite the first end 19 for selectable rotation relative to the differential case 12. At least two pinion gears 26 are rotatably supported in the gear chamber 16. Each of the at least two pinion gears 26 is in meshing engagement with the first side gear 18 and the second side gear 20.

In examples of the present disclosure, side gear dogs 22 may be defined on an outside diameter of the first side gear 18 parallel to the axis of rotation 14. Complementary dogs 42 may be defined around an inside surface 43 of the lock ring 40. The complementary dogs 42 may be selectably engagable with the side gear dogs 22 by translating the lock ring 40 along the axis of rotation 14 from a disengaged position (shown in FIG. 2) to an engaged position (not shown). In the engaged position, the lock ring 40 is translated to the left in the orientation shown in FIG. 2. A disengagement spring 34 may be disposed between the differential case 12 and the lock ring 40 to bias the lock ring 40 toward the disengaged position (shown in FIG. 2). The first side gear 18 is substantially prevented from rotating relative to the differential case 12 when the lock ring 40 is in the engaged position. The first side gear 18 is free to rotate relative to the differential case 12 when the lock ring 40 is in the disengaged position.

In examples of the present disclosure, a locking differential system 11 (e.g., FIG. 1) includes the locking differential assembly 10, 10', 10" as disclosed above. The locking differential system 11 also includes an electrical switch 17 to selectably close a circuit 23 to provide electrical power to a lock ring actuator 28 (shown schematically in FIG. 2). The electrical switch 17 shown in FIG. 1 is a rocker switch, however any switch capable of controlling the flow of power through the lock ring actuator 28 may be used. The electrical switch 17 may be a low current switch that controls a relay or transistor that directly controls power through the lock ring actuator 28. The differential system 11 also includes an electronic status indicator 29. Still further, the differential system 11 includes an electronic driver circuit 25 for powering the electronic status indicator 29 to indicate a status of the locking differential system 11. In examples of the present disclosure, the electronic driver circuit 25 may include an electronic control unit (ECU) in communication with the non-contacting sensor 15 to receive the electrically detectable signal indicative of the engagement status of the lock ring 40. The ECU is to determine the status of the locking differential system 11 based on the electrically detectable signal output by the non-contacting sensor 15. The determination of the status of the locking differential system 11 by the ECU may be based on signals and information other than or in addition to the electrically detectable signal output by the non-contacting sensor 15. For example, if vehicle battery power is low, the ECU may determine that the locking diffential system 11 is in an error state. The ECU may output the status to another portion of the electronic driver circuit 25 for powering the electronic status indicator 29 to indicate the status of the locking differential system 11.

The status may include at least three states. For example, the electronic status indicator 29 may be a selectably illuminated indicator 88, and the status may be indicated by a flash code. To illustrate, the selectably illuminated indicator 88 may include a light emitting diode, incandescent lamp, fluorescent lamp, or other selectably illuminable light source. It is to be understood that the electronic status indicator 29 may be any suitable indicator, for example, the electronic status indicator may be integrated into a graphic display. In examples in which the electronic status indicator 29 is a visual indicator, the visual indicator may be located on a dashboard, in an instrument cluster, on a mirror, on a steering wheel, on a shift control lever or button, on a console, on a sun visor, on a head up display, on a windshield, on a wearable device including a head mounted display, or any location visible to the operator of the vehicle while operating the vehicle. Further, the electronic status indicator 29 is not limited to visual indication; the electronic status indicator 29 may include an audible indicator (e.g., beep, buzz, tone, synthetic speech), haptic indicator (e.g., vibrating seat, steering wheel, or shift lever), or any electronic status indicator 29 audible to, or otherwise perceivable by, the operator of the vehicle wile operating the vehicle.

Figure 3:
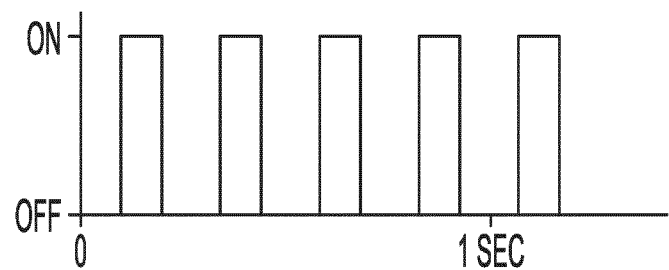
FIG. 3 is a time graph depicting an example of a flash code according to the present disclosure.

An example of a flash code may be as follows: the first state is indicated by not illuminating the electronic status indicator 29; the second state is indicated by continuously illuminating the electronic status indicator 29; and the third state is indicated by sequentially illuminating and not illuminating the electronic status indicator 29 with about a 50 percent duty cycle at a frequency between 1 and 20 hertz. FIG. 3 depicts a 50 percent duty cycle at a frequency of about 3 hertz. In FIG. 3, "On" means the electronic status indicator 29 is illuminated, and "Off" means the electronic status indicator 29 is not illuminated. States other than the three states in the example above, for example, error conditions, may be indicated by predetermined sequences of illuminating and not illuminating the electronic status indicator 29. An electronic diagnostic system (not shown) may be connected to the locking differential system 11 to determine if error conditions exist. For example, the electronic driver circuit 25 may include an ECU. The ECU may perform diagnostics based on inputs that include the electrically detectable signal output by the non-contacting sensor 15. The ECU may execute instructions embedded in a non-transitory, tangible memory device. The ECU may include analog circuitry, digital electronic elements and/or a digital computer processor for performing diagnostics, which may include determining the status of the locking differential system 11.

In an example, the status is selected from the group consisting of a first state, a second state, and a third state. In the example, the first state is a disengaged state having the electrical switch 17 in an open condition to disconnect power to the lock ring actuator 28 and the lock ring 40 is in the disengaged position. The second state is an engaged state having the electrical switch 17 in a closed condition connecting power to the lock ring actuator 28 and the lock ring 40 is in the engaged position. The third state is a transition state having the electrical switch 17 in an open condition disconnecting power to the lock ring actuator 28 and the lock ring 40 is in the engaged position or the electrical switch 17 is in a closed condition connecting power to the lock ring actuator 28 and the lock ring 40 is in the disengaged position (see FIG. 2). Indicating the transition state may reduce a tendency for an operator to continue to press a differential lock control button, or press the button harder, while the locking differential system 11 is in the transition state.

In examples of the present disclosure as depicted in FIG. 1, a sensor system 31 for detecting an engagement status of a lock ring 40 in a locking differential assembly 10 includes a selectably locking differential 41 for a vehicle axle assembly 8. The sensor system includes a differential case 12 defining an axis of rotation 14. A lock ring 40 is selectably engagable with a first side gear 18 to selectably prevent the first side gear 18 and a second side gear 20 from rotating relative to the differential case 12. A plunger 30, 30', 30" is translatable along a plunger axis 55 through a bore 68 in the differential case 12. The plunger 30, 30', 30" is to be in contact with the lock ring 40 at least when the lock ring 40 is engaged with the first side gear 18. In some examples, the plunger 30, 30' is spring-loaded to be in contact with the lock ring 40 at least when the lock ring 40 is engaged with the first side gear 18. In some examples, the plunger 30 is spring-loaded to remain in contact with the lock ring 40. In other examples (e.g., as shown in FIG. 5), the plunger 30" is attached to the lock ring 40, for example by a threaded connection, press-fit joint, or a weld joint. A position of the plunger 30, 30', 30" relative to the differential case 12 along the plunger axis 55 is indicative of an engagement status of the lock ring 40. A non-contacting sensor 15 is connected to the differential case 12. The non-contacting sensor 15 is located a fixed, predetermined distance from the differential case 12. The non-contacting sensor 15 is to detect a proximity of the plunger 30, 30', 30" to the non-contacting sensor 15 and to output an electrically detectable signal indicative of the engagement status of the lock ring 40.

The plunger axis 55 is parallel to the axis of rotation. The plunger axis 55 is spaced apart from the axis of rotation by a predetermined radius 37. The plunger axis 55 intersects the non-contacting sensor 15 at a predetermined angle of rotation of the differential case 12 about the axis of rotation.

In examples of the sensor system 31, the plunger 30 has a contact end 58 and a sensed end 63 distal to the contact end 58. The plunger 30 has a penetrating portion 57. The penetrating portion 57 is slidingly disposed through the bore 68 in the differential case 12.

In examples of the sensor system 31, the plunger 30 includes a cylindrical neck 93 extending from a cylindrical shank 90. The cylindrical neck 93 has a neck diameter 69 smaller than a shank diameter 71. A shoulder 91 is defined at an interface between the cylindrical neck 93 and the cylindrical shank 90. The bore 68 is a stepped cylindrical bore having a small diameter portion 65 and a large diameter portion 66. The small diameter portion 65 makes a sliding fit with the cylindrical neck 93. The large diameter portion 66 makes a sliding fit with the cylindrical shank 90. A helical spring 60' is disposed around the cylindrical neck 93 at least partially within the large diameter portion 66.

In examples of the sensor system 31, a spring 60 may be connected to the plunger 30 to urge the plunger 30 toward the lock ring 40. The spring 60 may be a helical spring 60' disposed around a neck 93 of the plunger 30 between the differential case 12 and a shoulder 91 of the plunger 30.

Some examples of the sensor system 31 include a plunger cartridge assembly 35 as depicted in FIG. 4. The plunger cartridge assembly 35 may be rigidly attached to the differential case 12. The plunger cartridge assembly 35 may be rigidly attached using a threaded connection, pressing into a press-fit, welding, adhesives, or any suitable attachment method. The plunger cartridge assembly 35 has a plunger cartridge body 33 with a cartridge bore 50 defined therein along the plunger axis 55. The plunger 30' has a contact end 58 and a sensed end 63 distal to the contact end 58. The plunger 30' is slidingly disposed in the cartridge bore 50. The plunger 30' has a penetrating portion 57. The penetrating portion 57 is slidingly disposed in the cartridge bore 50. A spring 60 is disposed in the cartridge bore 50. The spring 60 is connected to the plunger 30' to urge the plunger 30' toward the lock ring 40. As shown in the example depicted in FIG. 4, contact between the contact end 58 and the lock ring 40 may be interrupted when the lock ring 40 is fully disengaged as shown in FIG. 4. However, contact between the contact end 58 and the lock ring 40 is made before any of the complementary dogs 42 of the lock ring 40 engage or make contact with the side gear dogs 22.

The spring 60 may be a helical spring 60' disposed between the differential case 12 and a shoulder 91' of the plunger 30'. As shown in FIG. 4, there may be no neck protruding from the shoulder 91'. As such, the sensed end 63 of the plunger 30' may be flat, or even with the shoulder 91'. In other examples, there may be a cylindrical neck 93 similar to the example depicted in FIG. 2.

The plunger cartridge body 33 may have threads 85 defined on a cartridge outer diameter 94. The differential case 12 may have complementary threads 92 defined therein. The threads 85 defined in the plunger cartridge body 33 may engage the complementary threads 92 defined in the differential case 12 to rigidly attach the plunger cartridge assembly 35 to the differential case 12.

In examples of the sensor system 31, a bracket 32 is connected to the differential case 12 to support the non-contacting sensor 15. A bearing is disposed between the bracket 32 and the differential case 12 to reduce friction and wear between the bracket 32 and the differential case 12 during rotation of the differential case 12 about the axis of rotation 14. The bearing may be a thrust needle roller bearing.

In examples of the sensor system 31, a threaded nut 51 is attached to the bracket 32 to attach the non-contacting sensor 15 to the bracket 32.

In examples of the sensor system 31, a retention ring 102 is disposed partially in an annular groove 81 defined in the differential case 12 to retain the bracket 32 on the differential case 12.

In examples of the sensor system 31, the non-contacting sensor 15 is a Hall-Effect sensor. In examples of the sensor system 31, the non-contacting sensor 15 is a variable reluctance sensor.

In examples of the sensor system 31, a gear chamber may be defined by the differential case 12. The first side gear 18 is disposed at a first end 19 of the differential case 12 for selectable relative rotation thereto. The second side gear 20 is disposed at a second end of the differential case 12 opposite the first end 19 for selectable rotation relative to the differential case 12. At least two pinion gears 26 are rotatably supported in the gear chamber 16. Each of the at least two pinion gears 26 is in meshing engagement with the first side gear 18 and the second side gear 20.

In examples of the sensor system 31, the side gear dogs 22 may be defined on an outside diameter 24 of the first side gear 18 parallel to the axis of rotation 14. Complementary dogs 42 may be defined around an inside surface of the lock ring 40. The complementary dogs 42 being selectably engagable with the side gear dogs 22 by translating the lock ring 40 along the axis of rotation 14 from a disengaged position (see FIG. 2) to an engaged position.

In examples of the sensor system 31, a spring may be disposed between the differential case 12 and the lock ring 40 to bias the lock ring 40 toward the disengaged position (see FIG. 2). The first side gear 18 is substantially prevented from rotating relative to the differential case 12 when the lock ring 40 is in the engaged position. The first side gear 18 is free to rotate relative to the differential case 12 when the lock ring 40 is in the disengaged position (see FIG. 2).

It is to be understood that the terms "connect/connected/connection" and/or the like are broadly defined herein to encompass a variety of divergent connected arrangements and assembly techniques. These arrangements and techniques include, but are not limited to (1) the direct communication between one component and another component with no intervening components therebetween; and (2) the communication of one component and another component with one or more components therebetween, provided that the one component being "connected to" the other component is somehow in operative communication with the other component (notwithstanding the presence of one or more additional components therebetween).

In describing and claiming the examples disclosed herein, the singular forms "a", "an", and "the" include plural referents unless the context clearly dictates otherwise.

It is to be understood that any ranges provided herein include the stated range and any value or sub-range within the stated range.

Furthermore, when "about" is utilized to describe a value, this is meant to encompass minor variations (up to +/−10%) from the stated value.

Still further, reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. A locking differential assembly, comprising:
   a differential case defining an axis of rotation;
   a lock ring selectably engagable with a first side gear to selectably prevent the first side gear and a second side gear from rotating relative to the differential case;
   a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring;
   a plunger cartridge assembly rigidly attached to the differential case, the plunger cartridge assembly including:
   a plunger cartridge body having a cartridge bore defined therein along the plunger axis;
   the plunger having a contact end and a sensed end distal to the contact end, wherein:
      the plunger is slidingly disposed in the cartridge bore; and
      the plunger has a penetrating portion, the penetrating portion slidingly disposed in the cartridge bore; and
   a spring disposed in the cartridge bore, the spring being connected to the plunger to urge the plunger toward the lock ring; and
   a non-contacting sensor connected to the differential case, wherein:
      the non-contacting sensor is located a fixed, predetermined distance from the differential case; and
      the non-contacting sensor is to detect a proximity of the plunger to the non-contacting sensor and to output an electrically detectable signal indicative of the engagement status of the lock ring.

2. The locking differential assembly as defined in claim 1 wherein:
   the plunger axis is parallel to the axis of rotation;
   the plunger axis is spaced apart from the axis of rotation by a predetermined radius; and
   the plunger axis intersects the non-contacting sensor at a predetermined angle of rotation of the differential case about the axis of rotation.

3. The locking differential assembly as defined in claim 1 wherein:
   the plunger cartridge body has threads defined on a cartridge outer diameter;
   the differential case has complementary threads defined therein; and
   the threads defined in the plunger cartridge body engage the complementary threads defined in the differential case to rigidly attach the plunger cartridge assembly to the differential case.

4. The locking differential assembly as defined in claim 1, further comprising:
   a bracket connected to the differential case to support the non-contacting sensor; and
   a bearing disposed between the bracket and the differential case to reduce friction and wear between the bracket and the differential case during rotation of the differential case about the axis of rotation.

5. The locking differential assembly as defined in claim 4, further comprising a retention ring disposed partially in an annular groove defined in the differential case to retain the bracket on the differential case.

6. The locking differential assembly as defined in claim 4 wherein the bearing is a thrust needle roller bearing.

7. A locking differential system, comprising:
   the locking differential assembly as defined in claim 1;
   an electrical switch to selectably close a circuit to provide electrical power to a lock ring actuator;
   an electronic status indicator; and
   an electronic driver circuit for powering the electronic status indicator to indicate a status of the locking differential system wherein the status includes at least three states; wherein:
   the electronic driver circuit includes an electronic control unit (ECU) in communication with the non-contacting sensor to receive the electrically detectable signal indicative of the engagement status of the lock ring, the ECU to determine the status of the locking differential system based on the electrically detectable signal output by the non-contacting sensor;
   the status is selected from the group consisting of a first state, a second state, and a third state;
   the first state is a disengaged state having the electrical switch in an open condition to disconnect power to the lock ring actuator and the lock ring is in a disengaged position;
   the second state is an engaged state having the electrical switch in a closed condition connecting power to the lock ring actuator and the lock ring is in an engaged position;
   the third state is a transition state having the electrical switch in the open condition disconnecting power to the lock ring actuator and the lock ring is in the engaged position or the electrical switch is in the closed condition connecting power to the lock ring actuator and the lock ring is in the disengaged position; and
   the electronic status indicator is a selectably illuminated indicator and the status is indicated by a flash code.

8. A locking differential assembly, comprising:
   a differential case defining an axis of rotation;
   a lock ring selectably engagable with a first side gear to selectably prevent the first side gear and a second side gear from rotating relative to the differential case;
   a plunger translatable along a plunger axis through a bore in the differential case, the plunger being spring-loaded to remain in contact with the lock ring, a position of the plunger relative to the differential case along the plunger axis being indicative of an engagement status of the lock ring;

a non-contacting sensor connected to the differential case, wherein:
  the non-contacting sensor is located a fixed, predetermined distance from the differential case; and
  the non-contacting sensor is to detect a proximity of the plunger to the non-contacting sensor and to output an electrically detectable signal indicative of the engagement status of the lock ring;

a bracket connected to the differential case to support the non-contacting sensor;

a threaded nut attached to the bracket to attach the non-contacting sensor to the bracket;

a retention ring disposed partially in an annular groove defined in the differential case to retain the bracket on the differential case; and a thrust needle roller bearing disposed between the bracket and the differential case to reduce friction and wear between the bracket and the differential case during rotation of the differential case about the axis of rotation;

a gear chamber defined by the differential case, wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear;

side gear dogs defined on an outside diameter of the first side gear parallel to the axis of rotation;

complementary dogs defined around an inside surface of the lock ring, the complementary dogs selectably engagable with the side gear dogs by translating the lock ring along the axis of rotation from a disengaged position to an engaged position; and a disengagement spring disposed between the differential case and the lock ring to bias the lock ring toward the disengaged position; wherein:
  the first side gear is substantially prevented from rotating relative to the differential case when the lock ring is in the engaged position, and the second side gear is free to rotate relative to the differential case when the lock ring is in the disengaged position;
  the plunger axis is parallel to the axis of rotation;
  the plunger axis is spaced apart from the axis of rotation by a predetermined radius; and
  the plunger axis intersects the non-contacting sensor at a predetermined angle of rotation of the differential case about the axis of rotation;
  the plunger has a contact end and a sensed end distal to the contact end;
  the plunger has a penetrating portion, the penetrating portion slidingly disposed through the bore in the differential case;
  the plunger includes a cylindrical neck extending from a cylindrical shank;
  the cylindrical neck has a neck diameter smaller than a shank diameter;
  a shoulder is defined at an interface between the cylindrical neck and the cylindrical shank;
  the bore is a stepped cylindrical bore having a small diameter portion and a large diameter portion;
  the small diameter portion makes a sliding fit with the cylindrical neck;
  the large diameter portion makes a sliding fit with the cylindrical shank;
  a helical spring is disposed around the cylindrical neck between the differential case and the shoulder of the plunger, at least partially within the large diameter portion;
  the helical spring is connected to the plunger to urge the plunger toward the lock ring; and
  the sensor is selected from the group consisting of a Hall-Effect sensor and a variable reluctance sensor.

9. A sensor system for detecting an engagement status of a lock ring in a differential assembly, comprising:

a selectably locking differential for a vehicle axle;

a differential case defining an axis of rotation;

a lock ring selectably engagable with a first side gear to selectably prevent the first side gear and a second side gear from rotating relative to the differential case;

a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring; and a non-contacting sensor connected to the differential case, wherein:
  the non-contacting sensor is located a fixed, predetermined distance from the differential case;
  the non-contacting sensor is to detect a proximity of the plunger to the non-contacting sensor and to output an electrically detectable signal indicative of the engagement status of the lock ring;

a bracket connected to the differential case to support the non-contacting sensor;

a threaded nut attached to the bracket to attach the non-contacting sensor to the bracket;

a retention ring disposed partially in an annular groove defined in the differential case to retain the bracket on the differential case; and a thrust needle roller bearing disposed between the bracket and the differential case to reduce friction and wear between the bracket and the differential case during rotation of the differential case about the axis of rotation;

a gear chamber defined by the differential case, wherein the first side gear is disposed at a first end of the differential case for selectable relative rotation thereto, and the second side gear is disposed at a second end of the differential case opposite the first end for selectable rotation relative to the differential case; and at least two pinion gears rotatably supported in the gear chamber each of the at least two pinion gears in meshing engagement with the first side gear and the second side gear;

side gear dogs defined on an outside diameter of the first side gear parallel to the axis of rotation;

complementary dogs defined around an inside surface of the lock ring, the complementary dogs selectably engagable with the side gear dogs by translating the lock ring along the axis of rotation from a disengaged position to an engaged position; and a disengagement spring disposed between the differential case and the lock ring to bias the lock ring toward the disengaged position;

wherein:
  the plunger axis is parallel to the axis of rotation;

the plunger axis is spaced apart from the axis of rotation by a predetermined radius; and the plunger axis intersects the non-contacting sensor at a predetermined angle of rotation of the differential case about the axis of rotation.

10. The sensor system as defined in claim 9 wherein:

the plunger has a contact end and a sensed end distal to the contact end;

the plunger has a penetrating portion, the penetrating portion slidingly disposed through the bore in the differential case;

the plunger includes a cylindrical neck extending from a cylindrical shank;

the cylindrical neck has a neck diameter smaller than a shank diameter;

a shoulder is defined at an interface between the cylindrical neck and the cylindrical shank;

the bore is a stepped cylindrical bore having a small diameter portion and a large diameter portion;

the small diameter portion makes a sliding fit with the cylindrical neck;

the large diameter portion makes a sliding fit with the cylindrical shank;

a helical spring is disposed around the cylindrical neck at least partially within the large diameter portion; and the helical spring is disposed around the cylindrical neck between the differential case and the shoulder of the plunger, the helical spring to urge the plunger toward the lock ring.

11. The sensor system as defined in claim 9, further comprising a plunger cartridge assembly rigidly attached to the differential case, the plunger cartridge assembly including:

a plunger cartridge body having a cartridge bore defined therein along the plunger axis; and the plunger having a contact end and a sensed end distal to the contact end, wherein:

the plunger is slidingly disposed in the cartridge bore;

the plunger has a penetrating portion, the penetrating portion slidingly disposed in the cartridge bore;

a helical spring is disposed in the cartridge bore, the helical spring being connected to the plunger to urge the plunger toward the lock ring;

the helical spring is disposed between the differential case and a shoulder of the plunger;

the plunger cartridge body has threads defined on a cartridge outer diameter;

the differential case has complementary threads defined therein; and the threads defined in the plunger cartridge body engage the complementary threads defined in the differential case to rigidly attach the plunger cartridge assembly to the differential case.

12. A locking differential assembly, comprising:

a differential case defining an axis of rotation;

a lock ring selectably engagable with a first side gear to selectably prevent the first side gear and a second side gear from rotating relative to the differential case;

a plunger translatable along a plunger axis through a bore in the differential case, the plunger to be in contact with the lock ring at least when the lock ring is engaged with the first side gear, a position of the plunger relative to the differential case along the plunger axis being indicative of an engagement status of the lock ring; and a non-contacting sensor connected to the differential case, wherein:

the non-contacting sensor is located a fixed, predetermined distance from the differential case; and the non-contacting sensor is to detect a proximity of the plunger to the non-contacting sensor and to output an electrically detectable signal indicative of the engagement status of the lock ring;

a bracket connected to the differential case to support the non-contacting sensor; and a bearing disposed between the bracket and the differential case to reduce friction and wear between the bracket and the differential case during rotation of the differential case about the axis of rotation.

13. The locking differential assembly as defined in claim 12, further comprising a retention ring disposed partially in an annular groove defined in the differential case to retain the bracket on the differential case.

14. The locking differential assembly as defined in claim 12 wherein the bearing is a thrust needle roller bearing.

15. A locking differential assembly, comprising:

a differential case defining an axis of rotation;

a lock ring selectably engagable with a first side gear to selectably prevent the first side gear and a second side gear from rotating relative to the differential case;

a plunger translatable along a plunger axis through a bore in the differential case, the plunger axis being parallel to the axis of rotation and spaced apart from the axis of rotation by a predetermined radius, the plunger axis further intersecting the non-contacting sensor at a predetermined angle of rotation of the differential case about the axis of rotation, wherein the plunger has a contact end and a sensed end distal to the contact end, the plunger further having a penetrating portion slidably disposed through the bore in the differential case, the plunger to be in contact with the lock ring at least when the lock ring is engaged with the first side gear, a position of the plunger relative to the differential case along the plunger axis being indicative of an engagement status of the lock ring; the plunger further including a shoulder defined at an interface between a cylindrical neck extending from a cylindrical shank, the cylindrical neck having a neck diameter smaller than a shank diameter, wherein the bore is a stepped cylindrical bore having a small diameter portion and a large diameter portion, the small diameter portion making a sliding fit with the cylindrical neck, the large diameter portion making a sliding fit with the cylindrical shank, wherein a helical spring is disposed around the cylindrical neck at least partially within the large diameter portion; and a non-contacting sensor connected to the differential case, wherein:

the non-contacting sensor is located a fixed, predetermined distance from the differential case; and the non-contacting sensor is to detect a proximity of the plunger to the non-contacting sensor and to output an electrically detectable signal indicative of the engagement status of the lock ring.

16. The locking differential assembly as defined in claim 15, wherein the helical spring is connected to the plunger to urge the plunger toward the lock ring.

* * * * *